United States Patent [19]

Kondo

[11] 3,897,276

[45] July 29, 1975

[54] METHOD OF IMPLANTING IONS OF DIFFERENT MASS NUMBERS IN SEMICONDUCTOR CRYSTALS

[75] Inventor: Motoki Kondo, Tokyo, Japan

[73] Assignee: Nippon Electric Company, Limited, Tokyo, Japan

[22] Filed: June 20, 1973

[21] Appl. No.: 371,619

[30] Foreign Application Priority Data

June 27, 1972 Japan ............................... 47-64785

[52] U.S. Cl. ................ 148/1.5; 148/33.5; 148/187; 148/186; 357/13; 357/91

[51] Int. Cl.$^2$ ............................................ H01L 7/54

[58] Field of Search .................... 148/1.5, 187, 33.5; 357/91, 13; 117/201

[56] References Cited

UNITED STATES PATENTS

| | | | |
|---|---|---|---|
| 3,388,009 | 6/1968 | King | 147/187 X |
| 3,390,020 | 6/1968 | Mandelkorn | 148/1.5 |
| 3,628,185 | 12/1971 | Evans et al. | 357/91 X |

OTHER PUBLICATIONS

Seidel et al., Proceedings of the IEEE, Vol. 59, No. 9, August 1971, pp. 1222–1228, TK5700, 17.

*Primary Examiner*—G. Ozaki

*Attorney, Agent, or Firm*—Hopgood, Calimafde, Kalil, Blaustein & Lieberman

[57] ABSTRACT

In order to form a region of a predetermined conductivity type in a semiconductor crystal during the manufacture of an IMPATT diode, a variable capacity diode, or the like, the successive implantation of impurity ions is carried out under different implantation conditions in a manner known in the art but utilizing impurity ions of relatively high mass number, such as indium ions, for implantation in the deeper layer of the region and impurity ions of lower mass number, such as boron ions, for implantation in layers lying closer to the semiconductor crystal surface.

6 Claims, 2 Drawing Figures

PATENTED JUL 29 1975 3,897,276

METHOD OF IMPLANTING IONS OF DIFFERENT MASS NUMBERS IN SEMICONDUCTOR CRYSTALS

BACKGROUND OF THE INVENTION

This invention relates to a method of implanting impurity ions in order to introduce impurity atoms into a semiconductor crystal and to a semiconductor device manufactured by this method.

It is often desirable in a semiconductor device having at least one p-n junction that the distribution of the impurity concentration, or the doping profile, should exhibit an abrupt change at the p-n junction. For example, in order to achieve a high efficiency of oscillation with an IMPATT (Impact Ionization Avalanche Transit Time) diode having a p-n junction, the doping profile of the p-n junction should be in the form of stepwise change. An IMPATT diode, having a sloping doping profile of the p-n junction, has a lower efficiency of oscillation because the sloping doping profile results in an increase in the ratio of the avalanche region to the active region of the device and a consequent decrease in the negative conductance.

A double-drift-region IMPATT diode is a device having a $p^+$-p-n-$n^+$ structure. Such IMPATT diodes for use at millimeter-wavelengths are manufactured by use of ion implantation. In the prior art as described by Thomas E. Seidel, Ronald E. Davis, and David E. Inglesias in "The Proceeding of the IEEE," Vol. 59 (1971) No. 8, pages 1222 through 1228, a double-drift-region millimeter-wavelength IMPATT diode element is made from an epitaxially grown n-$n^+$ silicon semiconductor wafer by successively implanting boron acceptor ions several times through the exposed surface of the n-type epitaxial layer using different dose levels to provide layers at different depths within the wafer to form a p-type region adjacent to the exposed surface of the n-type epitaxial layer and then effecting thermal diffusion of boron from a highly concentrated atmosphere to form a surface $p^+$-type layer. The impurity atoms introduced into the wafer by implantation of the impurity ions with a preselected acceleration energy result in a Gaussian-like distribution on both sides of the projected implantation range $R_p$, which is the depth measured from the surface of the n-type epitaxial layer.

It has now been found that the range straggling $\Delta R$ representing the spread of the Gaussian-like distribution grows larger as the mass number of the implanted impurity atoms becomes smaller. This results from the fact that the impurity ions being implanted are scattered by the atoms constituting the semiconductor crystal in a wider range of angles with respect to the direction of implantation when the mass of the impurity ions being implanted becomes smaller as compared with the mass of the atoms of the semiconductor crystal. In conventional implantation for forming a junction in a conventional double-drift-region IMPATT diode, the mass numbers of boron and silicon are 11 and 28, respectively, and the boron ions are subjected to wide-angle scatter by the silicon atoms in the semiconductor crystal. The range straggling of the implanted boron atoms is therefore appreciably large to render the impurity distribution adjacent to the p-n junction sloping rather than stepwise. This reduces the efficiency of oscillation as mentioned above and is objectionable.

On the other hand, it should be pointed out in connection with the conventional method of implantation that boron ions are implanted several times at different depths $R_p$'s in order to form a p-type region having a substantially uniform acceptor concentration at a desired range of depth. To reduce the number of implantation steps and yet achieve uniformity of the impurity distribution, the range straggling of distribution of the implanted impurity atoms should be large. This is directly opposed to the above-mentioned condition for attaining a stepwise junction.

OBJECTS OF THE INVENTION

It is therefore an ojbect of the present invention to provide a method of implanting impurity ions into a semiconductor crystal, whereby it is possible to form a region of a predetermined conductivity type having a stepwise boundary at at least one end of the region.

It is another object of this invention to provide a method of the type described, which provides the region with a relatively small number of implantation steps.

It is a further object of this invention to provide a method of the type described, which is capable of providing double-drift-region IMPATT diodes having high efficiency of oscillation.

BRIEF DESCRIPTION OF THE INVENTION

According to this invention, there is provided a method of successively implanting impurity ions in a semiconductor crystal on different implantation conditions to form a region of a predetermined conductivity type at a preselected range of depth measured from one of the surfaces of said semiconductor crystal, including the steps of implanting impurity ions having a relatively high mass number in a layer of said region spaced farthest from said one surface and of implanting ions having a lower mass number in a number of layers of said region spaced closer to said one surface.

In accordance with this invention, the ion implantation is carried out preferably through a predetermined one of the crystal surfaces with the impurity ions of greater mass number being implanted first using a higher acceleration energy. At the deeper layer of the region of the predetermined conductivity type, the impurity atoms of greater mass number will be distributed with relatively small range straggling. The slope of the impurity concentration is therefore very steep in the vicinity of the deeper boundary of the region. In the shallower layers of the region, impurity ions of less mass number are distributed with a greater range straggling. This makes it possible to attain uniformity of the impurity concentration within the region and to reduce the number of successive implantations.

In accordance with the invention an improved semiconductor device is also provided. This device includes a semiconductor substrate of a first conductivity type, an epitaxial layer of the first conductivity type formed on the substrate, a layer of a first impurity material of a second conductivity type spaced a predetermined distance beneath the exposed surface of the epitaxial layer, the first impurity material having a first relatively high mass number, a plurality of layers of a second impurity material of the second conductivity type having a mass number lower than the first mass number, the plurality of layers lying between the exposed surface and the layer of the first impurity material.

DESCRIPTION OF THE PREFERRED EMBODIMENTS

Figure 1:
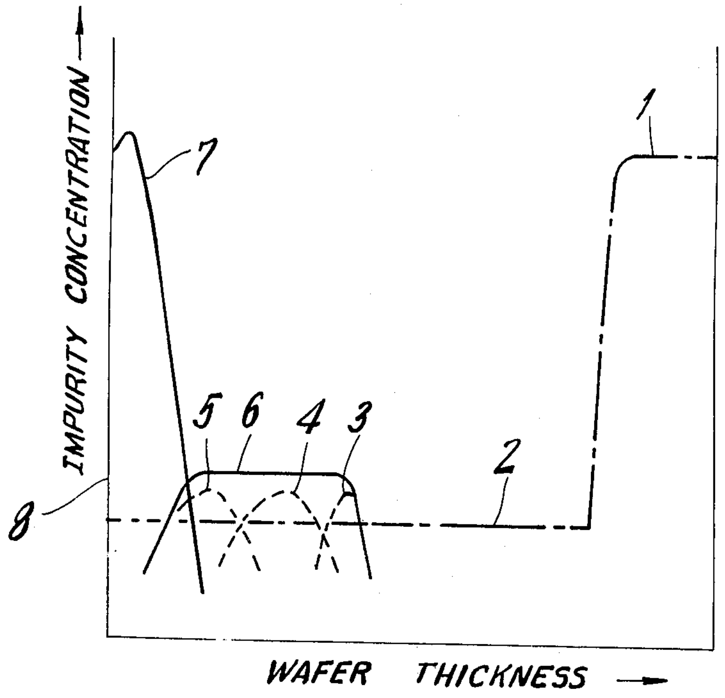
FIG. 1 schematically shows the impurity concentrations obtained in a semiconductor wafer according to a method of the instant invention plotted against the thickness of the wafer.
Figure 2:
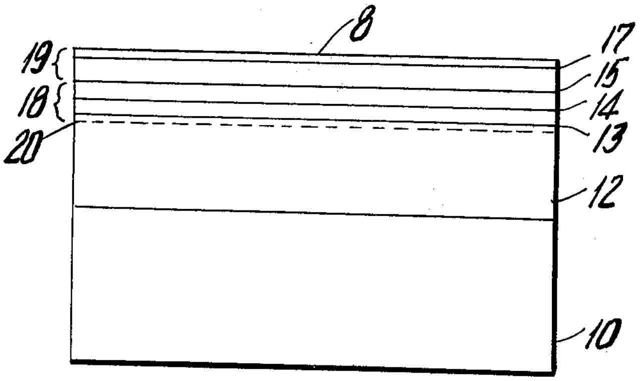
FIG. 2 is a schematic cross-sectional view of a semiconductor device manufactured according to the method of this invention.

Referring to FIGS. 1 and 2, the present invention will be described as applied to the manufacture of a silicon IMPATT diode element having a $p^+$-p-n-$n^+$ structure for use in the millimeter band of wavelengths. The abscissa of the schematic graph depicted in FIG. 1 represents the thickness of a silicon wafer in which the IMPATT diode elements are to be formed. The ordinate of the graph shows the concentrations of the electrically active impurity atoms.

Before application of the method according to this invention, an $n^+$-type silicon crystal substrate 10 is manufactured which has surfaces in the (111) plane and a distribution of donor impurity concentration as shown in the dashed line 1 in FIG. 1. An n-type silicon layer 12 having an impurity concentration illustrated as dashed line 2, which can be for example, $2 \times 10^{17}$ atoms/$cm^3$ is grown thereon by the use of epitaxial techniques. Through the exposed surface 8 of the epitaxially grown layer 12, indium ions whose mass number is 115 are implanted with an accelerating energy of 950 keV at, a dose level of $4 \times 10^{12}$ ions/$cm^2$, and at an angle of incidence of about 7° with respect to the [111] axis. As a result, the indium atoms are distributed in the manner shown by curve 3 with the center of the distribution 13 at a depth of 0.36 micron measured from the exposed surface 8 of the epitaxial layer 12 to overcompensate the donor concentration 2 and to form a p-type layer with epitaxial layer 2. The standard deviation which is the distance from the center of distribution to a point where the concentration is 0.61 times the highest concentration, will be used herein to express the range straggling in view of the Gaussian-like distribution. The standard deviation of the indium atom distribution as shown in curve 3 is about 0.047 micron and is small as compared with the standard deviation of 0.09 micron for boron atoms which would be implanted in a layer of the same depth. Subsequently, boron ions whose mass number is 11, are implanted at the same angle of incidence with an accelerating energy of 60 keV and at a dose level of $4 \times 10^{12}$ ions/$cm^2$. The boron atoms are thus distributed in the manner depicted by curve 4 with the center of distribution 14 placed at the depth of about 0.24 micron measured from the exposed surface 8 of the epitaxial layer 12. Boron ions are then implanted a second time at the same incidence angle but with an accelerating energy of 30 keV and a dose level of $2.5 \times 10^{12}$ ions/$cm^2$. These boron atoms are distributed as shown in curve 5 with the center of distribution 15 placed at the depth of about 0.12 micron measured from the exposed surface 8 of the epitaxial layer 12. The standard deviations of the distributions shown in curves 4 and 5 for the boron atoms are about 0.07 micron and 0.044 micron, respectively, in contrast to standard deviations of only about 0.032 micron and 0.018 micron for indium atoms if indium atoms had been implanted in layers of the same depths. It will now be understood that the boron atoms provide the largest range straggling among the acceptor atoms used in the silicon semiconductor crystal. The sum of the distributions shown in curves 3, 4, and 5 as shown in curve 6 which represents the p portion 18 of the structure, and results in a total distribution, which is substantially flat at the center portion and has a steep slope at the end representing the greatest depth beneath the exposed surface 8 or epitaxial layer 12. After the method according to this invention is thus employed, boron ions are implanted a third time at the same incidence angle and with an accelerating energy of 10 keV and a dose level of $1 \times 10^{15}$ ions/$cm^2$ to form a $p^+$-type layer 19 having a center of distribution 17 adjacent to the exposed surface 8 the distribution of which is shown in curve 7. The silicon wafer processed as described above is then annealed at 900°C for 10 minutes in a nitrogen atmosphere in order to electrically activate the implanted impurities. During the annealing, the impurity atoms are diffused a little causing an increase in the range straggling of the impurity distributions shown in the curves 3, 4, 5, and 7. The increase in the range straggling, however, is negligible as compared with the range straggling to which the impurity atoms are subjected at the time of the implantation.

In the $p^+$-p-n-$n^+$ structure thus manufactured and shown in FIG. 2, a p-n junction is formed along the dotted line 20 in FIG. 2 which is represented by the intersection of the impurity distributions shown in curves 2 and 6. Influenced by the small range straggling of the indium atom distribution as shown in curve 3, the p-n junction shown as dotted line 20 is a close approximation of the stepwise junction which is preferable in an IMPATT diode.

It will readily be understood that the method according to this invention is also applicable to the manufacture of variable capacity diodes and other semiconductor devices.

What is claimed is:

1. A method of successively implanting impurity ions in a semiconductor crystal in a plurality of implantation steps using different implantation conditions to form a region of a predetermined conductivity type over a preselected range of depths measured from one of the surfaces of said semiconductor crystal, said region having a plurality of layers including the steps of implanting impurity ions of a first relatively high mass number in the layer of said region spaced farthest from said one surface and implanting impurity ions of a second mass number lower than said first mass number in the layers of said region closer to said one surface.

2. A method as claimed in claim 1, wherein said impurity ions of said first relatively high mass number are implanted before said impurity ions of said second mass number.

3. A method as claimed in claim 2, wherein said predetermined conductivity type is p type, said impurity ions of said first relatively high mass number are indium ions, and said impurity ions of said mass number lower than said first mass number are boron ions.

4. A method as claimed in claim 3, wherein said indium ions are implanted in said semiconductor crystal using an accelerating energy of 950 keV, at a dose level of $4 \times 10^{12}$ ions/$cm^2$ and said boron ions are first implanted in said crystal using an accelerating energy of 60 keV, at a dose level of $4 \times 10^{12}$ ions/cm$^2$, and said boron ions are then implanted a second time in said crystal using an accelerating energy of 30 keV at a dose level of $2.5 \times 10^{12}$ ions/cm$^2$.

5. A method as claimed in claim 4, including the additional step of implanting said boron atoms a third time using an accelerating energy of 10 keV and a dose level of $1 \times 10^{15}$ ions/cm$^2$.

6. A method as claimed in claim 5, including the additional step of heating said semiconductor crystal for approximately 10 minutes at a temperature of approximately 900°C in a nitrogen atmosphere.

* * * * *